(12) United States Patent
Boesch et al.

(10) Patent No.: US 8,395,256 B2
(45) Date of Patent: Mar. 12, 2013

(54) PACKAGING FOR LOW-COST, HIGH-PERFORMANCE MICROWAVE AND MILLIMETER WAVE MODULES

(75) Inventors: Ronald D. Boesch, Cary, NC (US); Edwin John Nealis, Cary, NC (US); Costel Nicolae, Dollard-des-Ormeaux (CA)

(73) Assignee: Harris Stratex Networks Operating Corporation, Morrisville, NC (US)

( * ) Notice: Subject to any disclaimer, the term of this patent is extended or adjusted under 35 U.S.C. 154(b) by 946 days.

(21) Appl. No.: 11/670,952

(22) Filed: Feb. 2, 2007

(65) Prior Publication Data
US 2008/0188098 A1   Aug. 7, 2008

(51) Int. Cl.
*H01L 23/34* (2006.01)

(52) U.S. Cl. ........ 257/728; 257/678; 257/684; 257/734; 257/E21.499

(58) Field of Classification Search ............ 257/728, 257/678, 684, 734, E21.499
See application file for complete search history.

(56) References Cited

U.S. PATENT DOCUMENTS

| | | |
|---|---|---|
| 4,961,190 A | 10/1990 | Nakajima |
| 5,125,008 A | 6/1992 | Trawick et al. |
| 5,230,097 A | 7/1993 | Currie et al. |
| 5,329,520 A | 7/1994 | Richardson et al. |
| 5,437,051 A | 7/1995 | Oto |
| 5,451,818 A | 9/1995 | Chan et al. |
| 5,740,157 A | 4/1998 | Demiray et al. |
| 5,742,639 A | 4/1998 | Fasulo et al. |
| 5,770,971 A | 6/1998 | McNicol |
| 5,774,784 A | 6/1998 | Ohno |
| 5,797,043 A | 8/1998 | Lewis et al. |
| 5,822,553 A | 10/1998 | Gifford et al. |
| 5,956,324 A | 9/1999 | Engdahl et al. |
| 5,991,312 A | 11/1999 | Koenig et al. |
| 6,114,986 A | 9/2000 | Cassen et al. |
| 6,498,551 B1 | 12/2002 | Ammar et al. |
| 6,513,092 B1 | 1/2003 | Gorshe |
| 6,531,982 B1 | 3/2003 | White et al. |
| 6,560,202 B1 | 5/2003 | Bordogna et al. |

(Continued)

FOREIGN PATENT DOCUMENTS

| | | |
|---|---|---|
| JP | 7249944 | 9/1995 |
| JP | 2003078356 | 3/2003 |

OTHER PUBLICATIONS

PCT International Search Report and Written Opinion dated Jul. 7, 2008 for International Application No. PCT/US08/52359.

(Continued)

*Primary Examiner* — Junghwa M Im
(74) *Attorney, Agent, or Firm* — Sheppard Mullin Richter & Hampton LLP (57) ABSTRACT

Microwave or millimeter wave system packaging having a system with a baseplate, transition board and cover. The baseplate includes microwave or millimeter wave components attached thereto. The transition board includes a first connector attached to a first side thereof and operatively connected to the components, and a second connector attached to a second side thereof and operatively connected to the components through the board. The cover and baseplate form a cavity containing the board and components, and the second connector may be operatively connected to a third connector such as a printed circuit board disposed outside of the cavity and on a higher level assembly. The transition board may further include a fourth connector operatively connected to the components for providing a signal to an external component or device or receiving a signal from an external component or device.

37 Claims, 9 Drawing Sheets

U.S. PATENT DOCUMENTS

| | | | |
|---|---|---|---|
| 6,563,883 B1 | 5/2003 | Leinonen et al. | |
| 6,594,479 B2 | 7/2003 | Ammar et al. | |
| 6,603,810 B1 | 8/2003 | Bednekoff et al. | |
| 6,687,217 B1 | 2/2004 | Chow et al. | |
| 6,819,720 B1 | 11/2004 | Willetts | |
| 6,943,627 B2 | 9/2005 | Leyonhjelm et al. | |
| 6,947,711 B1 | 9/2005 | Leyonhjelm | |
| 6,950,654 B2 | 9/2005 | Jao et al. | |
| 6,998,708 B2 | 2/2006 | Ammar | |
| 7,016,435 B2 | 3/2006 | Adachi | |
| 7,031,409 B2 | 4/2006 | Brobston et al. | |
| 7,058,369 B1 | 6/2006 | Wright et al. | |
| 7,099,399 B2 | 8/2006 | McCallister | |
| 2001/0046239 A1 | 11/2001 | Colombo et al. | |
| 2002/0093393 A1* | 7/2002 | Henningsson et al. | 333/125 |
| 2002/0097737 A1 | 7/2002 | Traverso et al. | |
| 2002/0111150 A1 | 8/2002 | Pleasant et al. | |
| 2002/0123364 A1 | 9/2002 | Palmeri et al. | |
| 2002/0154620 A1 | 10/2002 | Azenkot et al. | |
| 2003/0162522 A1 | 8/2003 | Valtolina et al. | |
| 2003/0199283 A1 | 10/2003 | Busch | |
| 2004/0052320 A1 | 3/2004 | Lennen | |
| 2004/0203709 A1 | 10/2004 | Luneau | |
| 2004/0263378 A1 | 12/2004 | Jossef et al. | |
| 2005/0053008 A1* | 3/2005 | Griesing et al. | 370/241 |
| 2005/0105642 A1 | 5/2005 | Muller et al. | |
| 2005/0156662 A1 | 7/2005 | Raghupathy et al. | |
| 2005/0195919 A1 | 9/2005 | Cova | |
| 2005/0260961 A1 | 11/2005 | Cowley et al. | |
| 2006/0049870 A1 | 3/2006 | Helberg | |
| 2006/0078069 A1 | 4/2006 | Seendripu et al. | |
| 2006/0089114 A1 | 4/2006 | Maxim et al. | |
| 2006/0112075 A1 | 5/2006 | Hellerstein et al. | |
| 2006/0112175 A1 | 5/2006 | Sellers et al. | |
| 2006/0141974 A1 | 6/2006 | Campbell et al. | |
| 2006/0223474 A1 | 10/2006 | Yoshizaki et al. | |
| 2007/0019109 A1 | 1/2007 | Lombardi et al. | |
| 2007/0064835 A1 | 3/2007 | Auranen | |
| 2007/0076818 A1 | 4/2007 | Barnes et al. | |

OTHER PUBLICATIONS

PCT International Search Report and Written Opinion dated Apr. 11, 2008 for International Application No. PCT/US07/88655.

* cited by examiner

PACKAGING FOR LOW-COST, HIGH-PERFORMANCE MICROWAVE AND MILLIMETER WAVE MODULES

BACKGROUND

Recent advances in microelectronic technologies have resulted in improvements in operating frequency capabilities of specialized electronic devices such as monolithic microwave integrated circuits (MMICs) and other millimeter wave and microwave devices. These devices are well suited for and often utilized in military and commercial applications requiring wireless communication, detection, ranging and guidance at high frequencies.

The performance capabilities of the devices may be compromised by mounting the device into a package or assembly that adds parasitics and degrades the signal characteristics at higher operating frequencies. These assemblies typically allow an electronic device to be mounted within a suitable enclosure while enabling RF input and output (I/O) signals, as well as a DC bias signal, to be communicated through the assembly walls to the device itself, or conversely, from the device to external complimentary circuits. These devices are typically in the form of modules as an increasing use is made of millimeter wave and microwave transceivers and other such devices. Often, these modules are utilized with various transceiver designs having different transmitter and receiver circuits that make use of a number of different MMIC chips or dies.

Prior art RF assemblies of this type, and more specifically the assembly transitions, are often found to have high RF losses, voltage reflections, electrical mismatching and discontinuity inadequacies that exceed acceptable limits and may limit frequency performance capabilities. This often fails to maximize the performance potential of an electronic device or communication system or may degrade device and system performance. Alternatively, expensive cables and/or connectors are designed into the assemblies to preserve the device performance and to preserve the signal characteristics as they travel through the assemblies.

For example, three areas of packaging representative of devices or modules in the microwave and millimeter wave industry are connectorized amplifiers, internally matched field effect transistors (FET), and surface-mount packaged MMICs. Connectorized amplifiers may generally be characterized by their ruggedness. The respective housings generally include coaxial RF connectors (e.g., two if a 2-port device or more if the device is an n-port). These connectors are typically "field replaceable" surface mount assemblies that possess an RF feed-through soldered or brazed into the housing (e.g., bathtub style or separate ringframe). Additionally, in typical prior art assemblies, DC is brought into the respective housing through capacitively coupled feed-throughs that may be soldered or brazed into the housing. Generally, the RF path is connected to other modules through coaxial cable assemblies, and the DC connections are soldered, or connected to other modules through DC cable assemblies. Such an assembly or package is hermetic and in this sense, it may be labeled as "military microwave hardware" with the expense implied therefrom.

Internally Matched FETs generally represent a focus on the commercial sector and, as such, these devices are not expected to endure the conditions required by military applications. These respective assemblies are typically constrained to 1-stage, 2-port devices and are used for high-power devices where the corresponding baseplate material is employed for heat transfer purposes. The FET may be attached to the baseplate to minimize the thermal resistance of the heat path. Generally, a hard ceramic material is employed on the I/Os to provide a power match to the respective device. Bondwires are used to attach the device to the ceramic material, and a tab is generally attached to the ceramic material and extended from the assembly to provide both an RF connection and DC connection. The DC connections are typically gate (−V), drain (+V) and source (ground) connections. Thus, the intended use of such a device is to have a respective assembly contain a printed circuit board (PCB) to accept the internally matched FET. The assembly is then mechanically attached for thermal and electrical grounding, and the RF I/O tabs are soldered to the PCB.

Surface-mount packaged devices generally possess two or more RF ports depending upon the functionality thereof (e.g., amplifiers, mixers, MMICs, FETs, etc.). A typical attachment method is soldering all pins rather than a mechanical attachment means. For devices dissipating significant power, the accepting PCB generally includes plural vias to remove the associated heat. In this example, the package may possess a back-side metal paddle in addition to the pins. Such packages are generally limited in frequency to prevent parasitics from impacting the performance of the internal device. Therefore, improvements to these packages are desired to reduce their associated parasitics and extend their range of unimpaired useful frequencies. Generally, the number of devices in such a package is limited since suppliers desire to target the maximum number of users. An exemplary industry focusing upon multiple chip solutions inside the package is the cell phone and 802.11 card business.

Thus, a continuing need exists for an improved assembly, particularly for microwave and millimeter wave systems operating in higher frequency ranges. As greater uses are made for microwave and millimeter wave modules, it would be advantageous if a unique structure and method could be found that addressed the low cost and performance requirements in the area of millimeter wave and microwave modules without degradation to the technical performance of a respective transceiver, transmitter, or receiver and/or communication system.

SUMMARY

Embodiments of the present subject matter address the problems encountered in the prior art by providing a solution at a subsystem level. For example, a respective package may possess an enclosure to physically protect the contents, enable easy assembly of the microwave/millimeter wave components, utilize inexpensive RF/DC connectors, and provide for connections to a higher level assembly that provides a protected electromagnetic interference environment.

The aforementioned prior art systems and methods fail to address the performance requirements in microwave and millimeter wave radio systems. Accordingly, there is a need for a novel method and system that would overcome the deficiencies of the prior art. Thus, an embodiment of the present subject matter provides a module comprising a baseplate having a microwave or millimeter wave component attached thereto and a substantially planar transition board having a first connector attached to a first side of the board and operatively connected to the component, and a second connector attached to a second side of the board and operatively connected to the component through the board. The module further comprises a cover where the cover and baseplate form a cavity containing the board and component and where the second connector is operatively connected to a third connector disposed outside of the cavity. An alternative embodiment may further include a fourth connector on the transition board operatively connected to the component for providing a signal to an external component or device or receiving a signal from an external component or device.

Another embodiment of the present subject matter provides an assembly comprising a structure having an indentation for accepting a module. The indentation may be bounded on one side of a printed circuit board where the module comprises a baseplate having a microwave or millimeter wave component attached thereto, a substantially planar transition board having a first connector attached to a first side of the board and operatively connected to the component, and a second connector attached to a second side of the board and operatively connected to the component through the board, and a first cover where the first cover and baseplate form a cavity containing the board and component. An alternative embodiment may further include another connector on the transition board operatively connected to the component for providing a signal to an external component or device or receiving a signal from an external component or device. The assembly may further comprise a second cover where the module is disposed within the indentation such that the second connector is operatively connected to the printed circuit board, and where the second cover and structure enclose the module.

An additional embodiment of the present subject matter provides a communication system operating in a predetermined frequency range. The system may comprise a plurality of assemblies, at least one assembly comprising a structure having an indentation for accepting a module, the indentation bounded on one side by a printed circuit board. The module comprises a baseplate having a microwave or millimeter wave component attached thereto, a substantially planar transition board having a first connector attached to a first side of the board and operatively connected to the component, and a second connector attached to a second side of the board and operatively connected to the component through the board, and a first cover where the first cover and baseplate form a cavity containing the board and component. An alternative embodiment may further include another connector on the transition board operatively connected to the components for providing a signal to an external component or device or receiving a signal from an external component or device. The assembly may further comprise a second cover, where the module is disposed within the indentation such that the second connector is operatively connected to the printed circuit board, and where the second cover and structure enclose the module.

A further embodiment of the present subject matter provides a method for eliminating feed-throughs in an assembly. The method comprises the steps of providing a structure having an indentation for accepting a module, the indentation bounded on one side by a printed circuit board and operatively connecting a module to the printed circuit board. The module may generally comprise a baseplate having a microwave or millimeter wave component attached thereto, a substantially planar transition board having a first connector attached to a first side of the board and operatively connected to the component, and a second connector attached to a second side of the board and operatively connected to the component through the board. An alternative embodiment may further include another connector on the transition board operatively connected to the components for providing a signal to an external component or device or receiving a signal from an external component or device. The module may further comprise a first cover where the first cover and baseplate form a cavity containing the board and component. The method further comprises the step of removably attaching a second cover to the structure to enclose the module.

These embodiments and many other features and advantages thereof will be readily apparent to one skilled in the art to which the invention pertains from a perusal of the claims, the appended drawings, and the following detailed description of the embodiments.

DETAILED DESCRIPTION

With reference to the figures where like elements have been given like numerical designations to facilitate an understanding of the present subject matter, the various embodiments of a system, method and apparatus for packaging for low-cost, high-performance microwave and millimeter wave modules are herein described.

Figure 1:
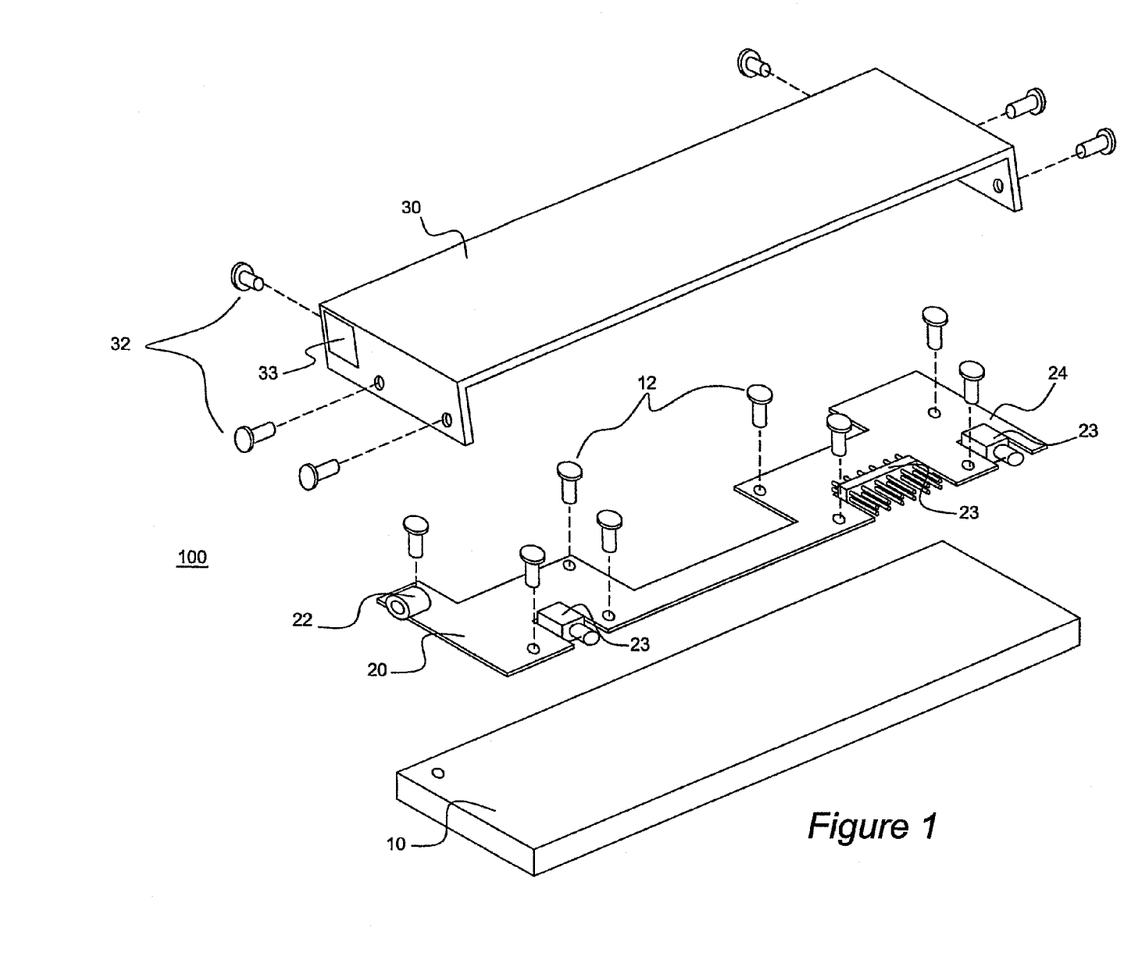
FIG. 1 is a perspective view of a module according to an embodiment of the present subject matter.

FIG. 1 is a perspective view of a module according to an embodiment of the present subject matter. With reference to FIG. 1, a module 100 is illustrated having a baseplate 10 adaptable to possess microwave or millimeter wave components (not shown) assembled thereon. Exemplary components may be DC and/or RF components. For example, the components may he monolithic microwave integrated circuit chips (MMIC), field effect transistors, transistors, diodes, mixers, multipliers, modulators, amplifiers, attenuators, switches, circulators, isolators, filters, couplers, detectors, splitters, combiners, alumina (or other ceramic) substrates for matching transistors or MMICs, alumina (or other ceramic) substrates for realizing microwave/millimeter wave functions, or any combinations thereof. Additional, components that may be assembled on the baseplate also include duroid (softboard) to realize microwave/millimeter wave functions, and/or hardboard for bias circuitry, signal conditioning, etc. The embodiment of the present subject matter illustrated in FIG. 1 is adaptable to all microwave frequency applications such as, but not limited to, a transmitter, a receiver, a transceiver, etc., and the components thereof may be modified to different ranges of desired frequencies. For example, any one or a number of the aforementioned components may operate in the 6 GHz point to point radio band. Thus, if the module employs a 3-port with mixing function, the RF range may he significantly wider than 2 GHz; however, the aforementioned frequency ranges are not intended to limit the scope of the claims appended herewith and embodiments of the present subject matter may be utilized with a wide range of frequencies.

The baseplate 10 of the module 100 may be substantially flat to enable "pick and place" installation of microwave/millimeter wave components thereto. In an alternative embodiment of the present subject matter, the baseplate 10 may include a raised area coated with epoxy for the attachment of the microwave/millimeter wave components. The components may thus be assembled directly onto the baseplate 10 that may be coated with conductive epoxy without any carriers. Further, an auto-bonder may be utilized to provide RF and/or DC connections between any components on the baseplate 10.

A substantially planar transition board 20 may be operatively and/or removably connected to the components on the baseplate 10 by screws, bolts, pins 12 or another attachment means such as epoxy. An exemplary transition board 20 may include, but is not bruited to, hardboard, such as FR-4. The transition board 20 may possess a first set of connectors operatively connected to the components and a second set of connectors 23 attached to a second side 24 of the transition board 20. An exemplary first set of connectors may be bondwire or other known connectors in the art. The connections to the components on the baseplate 10 provided by the first connectors may be direct connections without a wire or cable, e.g., an autobond to the components for DC and RF connections. The second connectors 23 are operatively connected to the components through the transition board 20 and may be attached thereto by epoxy, screws, pins or other known attachment means. An alternative embodiment of the present subject matter may employ a transition board 20 having a first portion and a second portion rather man a single substantially planar board. For example, the first portion may possess the first Set of connectors facing the baseplate 10 operatively connected to the components. The second portion may possess the second set of connectors 23 operatively connected to the components through the board. Further, in this alternative embodiment, the two portions may be constructed of different materials.

The module 100 further includes a cover 30 that forms a cavity containing the transition board 20 and any components on the baseplate 10. The cover 30 may thus be utilized to protect any bondwires and provide a fixed cavity environment for the microwave/millimeter wave components. The cover 30 may be constructed of metal or may be metallized to provide the fixed electrical environment. The cover 30, however, does not provide a controlled EMI environment for the module; rather, a higher level assembly may provide this function. The cover 30 may be mechanically and removably attached to the baseplate 10 by screws, bolts, pins or other attachment means 32 to enable reworking and/or testing of microwave/millimeter wave components.

The second connectors 23 may be operatively connected to a third connector (not shown) disposed outside of the cavity formed by the baseplate 10 and cover 30. For example, an embodiment of the present subject matter may utilize blind mate connectors as the second connectors 23 to mate with a printed circuit board (PCB) positioned on a higher level assembly disposed outside of the cavity. Thus, the module may provide power and signal connections to the transition board 20 rather than to either the baseplate 10 or the cover 30 to eliminate the need for expensive cabling to make the DC and RF connections. Therefore, connections provided on and through the transition board 20 replace the expensive, feedthroughs (e.g., DC, capacitive, and RF) traditionally used in the prior art and enable quick, unimpaired DC and RF connection to a higher level assembly. Exemplary DC connectors may be inexpensive DC connectors, e.g., one penny per pin, that arrive soldered to the transition board 20. Alternative embodiments of the present subject matter may also employ DC connectors with surface mount PCB capacitors soldered to the transition board 20 to preclude problems with conducted emissions and interference.

Further embodiments of the present subject matter may employ a fourth set of connectors 22. The fourth connectors 22 may be operatively connected to the components directly or through the transition board 20 and may be attached thereto by epoxy, screws, pins or other known attachment means. For example, a module 100 according to an embodiment of the present subject matter may be employed in a transmitter. The fourth connector 22 may then provide an output signal to an external component or device, and the second connectors 23 may receive an input signal. A module 100 may also be employed in a receiver. In such an embodiment, the fourth connector 22 may receive an input signal from an external component or device, and the second connectors 23 may provide an output signal. Exemplary fourth connectors may be a waveguide launch, RF connectors, or other devices and/or connectors for inputting or outputting a signal. Embodiments of the present subject matter employing the fourth connector(s) 22 may further include a corresponding aperture 33 in the cover 30 to provide access to and from the fourth connector(s) 22. Modules according to embodiments of the present subject matter are adaptable to all microwave frequency applications such as, but not limited to, a transmitter, a receiver, a transceiver, etc., and communication systems employing such applications, and the aforementioned examples are not intended to limit the scope of the claims appended herewith.

Figure 2A:
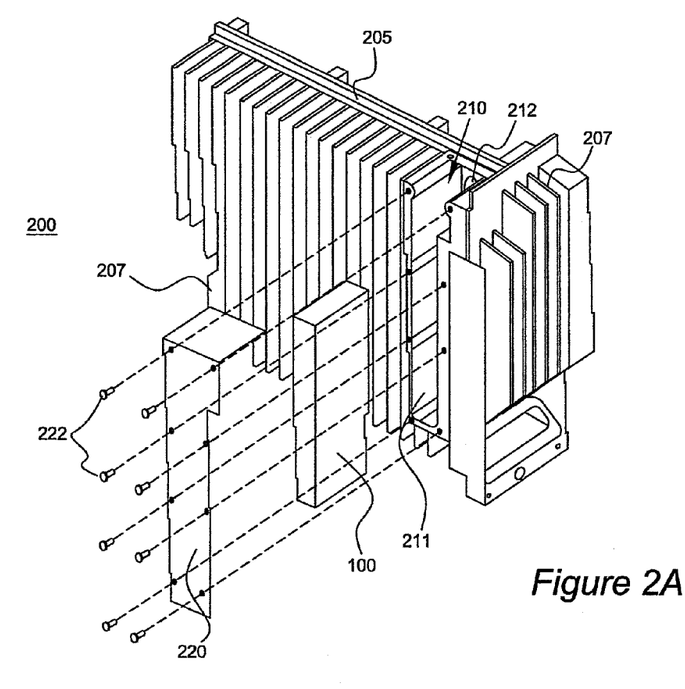
FIGS. 2A and 2B are perspective views of an assembly according to an embodiment of the present subject matter.
Figure 2B:
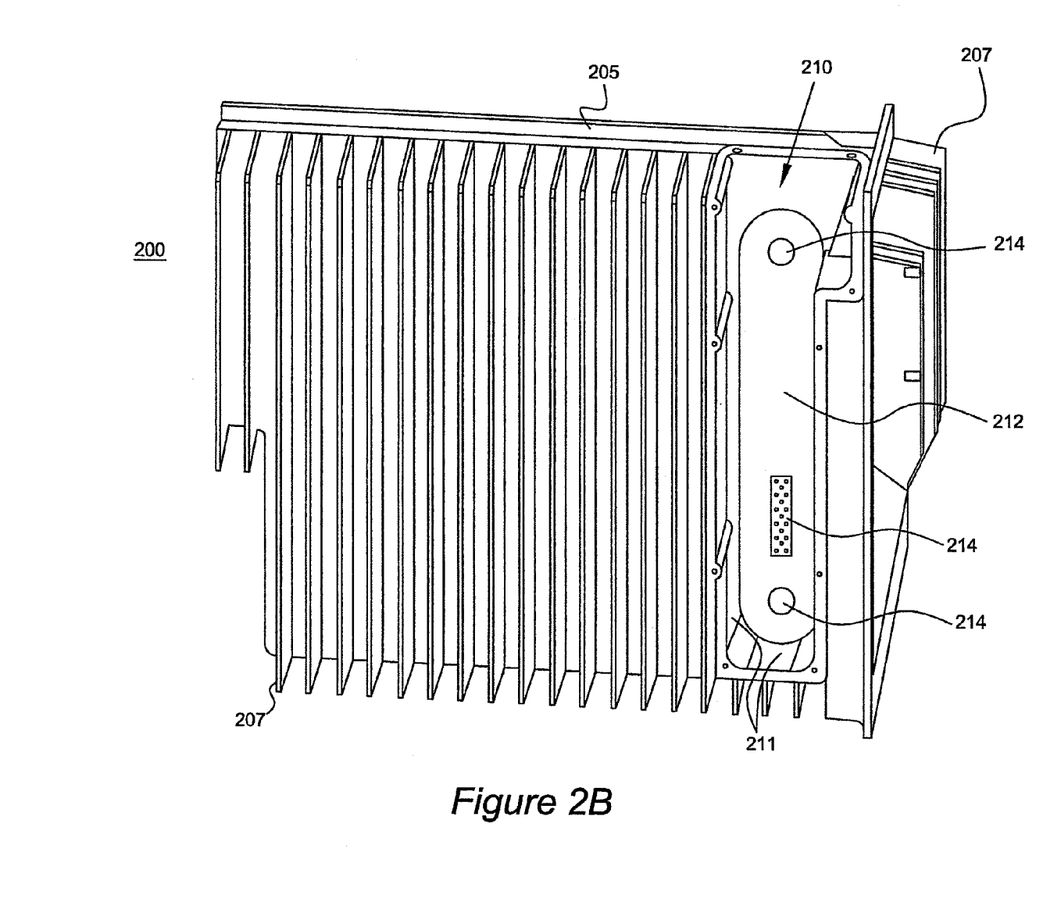

FIGS. 2A and 2B are perspective views of an assembly according to an embodiment of the present subject matter. With reference to FIGS. 2A and 2B, an assembly 200 is provided having structure 205 with an indentation 210 for accepting a module 100 according to an embodiment of the present subject matter. The indentation 210 may be bounded on one side thereof by a printed circuit board (PCB) 212, two sides by a second cover 220, and the remaining three sides by aluminum housing 211. The PCB 212 may be operatively connected to the module 100 via a third set of connectors 214 adaptable to mate with the second connectors 23. For example, an embodiment of the present subject matter may utilize blind mate connectors 214 on the PCB 212 to mate with the second connectors 23 on a module 100. Thus, the assembly 200 may provide power and signal connections to the module 100 and eliminate any expensive cabling to make the DC and RF connections and enable quick, unimpaired DC and RF connection to the module 100.

The second cover 220 is adaptable to mechanically and removably attach to the structure of the assembly 200 and enclose a module 100 operatively connected to the PCB 212. The cover 220 may be attached to the structure 205 by screws, bolts, pins or other attachment means 222 to allow simple access to and installation of the module 100. The indentation 210 together with the second cover 222 defines a cavity that provides electromagnetic interference protection for an enclosed module 100. Furthermore, portions 207 of the structure 205 may provide tins or another known heat transfer structure to convey heat away from the module 100. The embodiment of the present subject matter illustrated in FIGS. 2A and 2B is adaptable to all microwave frequency applications such as, but not limited to, a transmitter, a receiver, a transceiver, etc., and communication systems employing such, applications. Further, communication systems having assemblies according to embodiments of the present subject matter may employ plural assemblies depending upon the requirements of the respective system.

Figure 3:
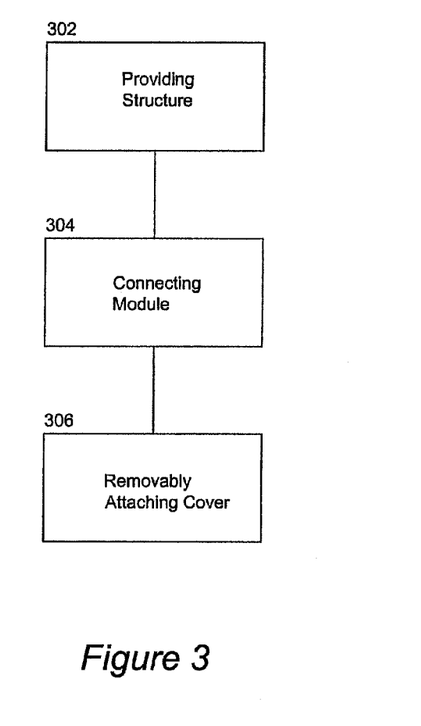
FIG. 3 is a flowchart illustrating a method for eliminating feed-throughs in an assembly according to an embodiment of the present subject matter.

FIG. 3 is a flowchart illustrating a method for eliminating feed throughs in an assembly according to an embodiment of the present subject matter. With reference to FIG. 3, in step 302, a structure is provided having an indentation for accepting a module. The indentation may be bounded on one side thereof by a PCB. In step 304, a module may be operatively connected to the PCB. The module may comprise a baseplate having microwave or millimeter wave components attached thereto, a transition board having a first connector attached to a first side thereof and operatively connected to the components, and a second connector attached to a second side thereof and operatively connected to the components through the transition board. The module may further comprise a first cover where the cover and baseplate form a cavity containing the board and the microwave/millimeter wave components attached to the baseplate. In step 306, a second cover may be removably attached to the structure to enclose the module. Through the attachment of the second cover to the structure, thereby enclosing a module operatively connected to the PCB, the second cover acts to provide electromagnetic interference protection for the module. Alternative embodiments of the present subject matter may employ a gasket in portions of the indentation, second cover, and/or interface therebetween to provide electromagnetic interference protection for the module. The structure also provides a heat sink for heat generated by the module and components therein.

Figure 4A:
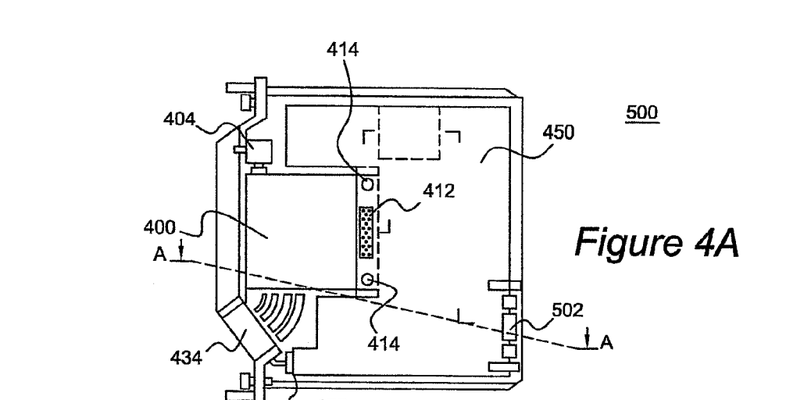
FIG. 4A is a plan view of an assembly according to another embodiment of the present subject matter.
Figure 4B:
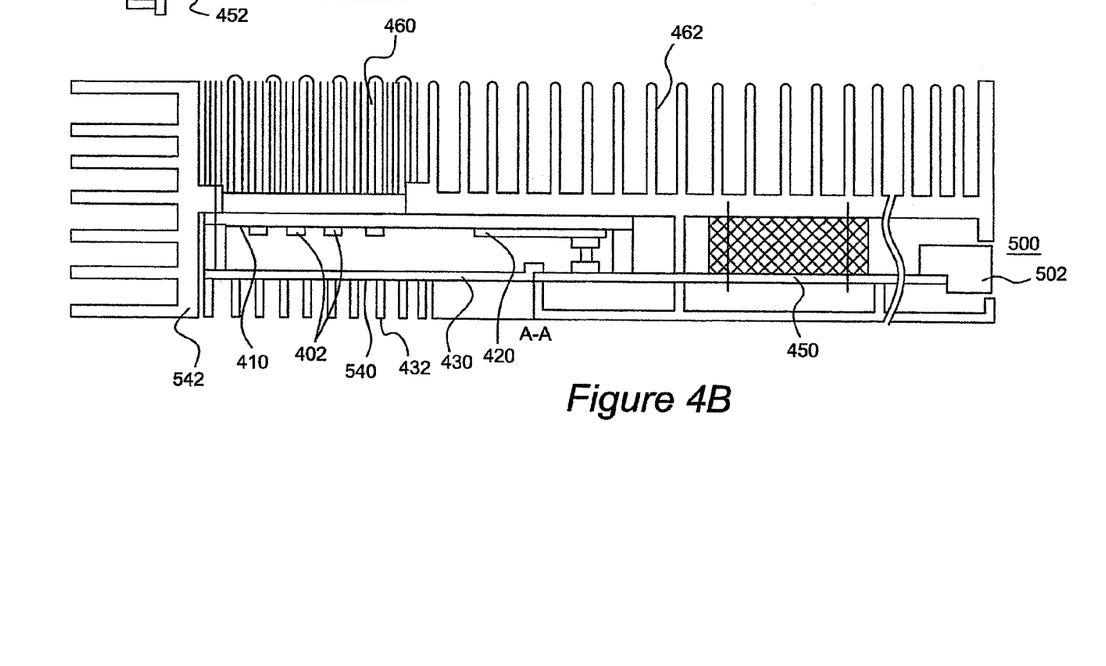
FIG. 4B is a cross section of the assembly of FIG. 4A along line A-A.
Figures 5A, 5B:
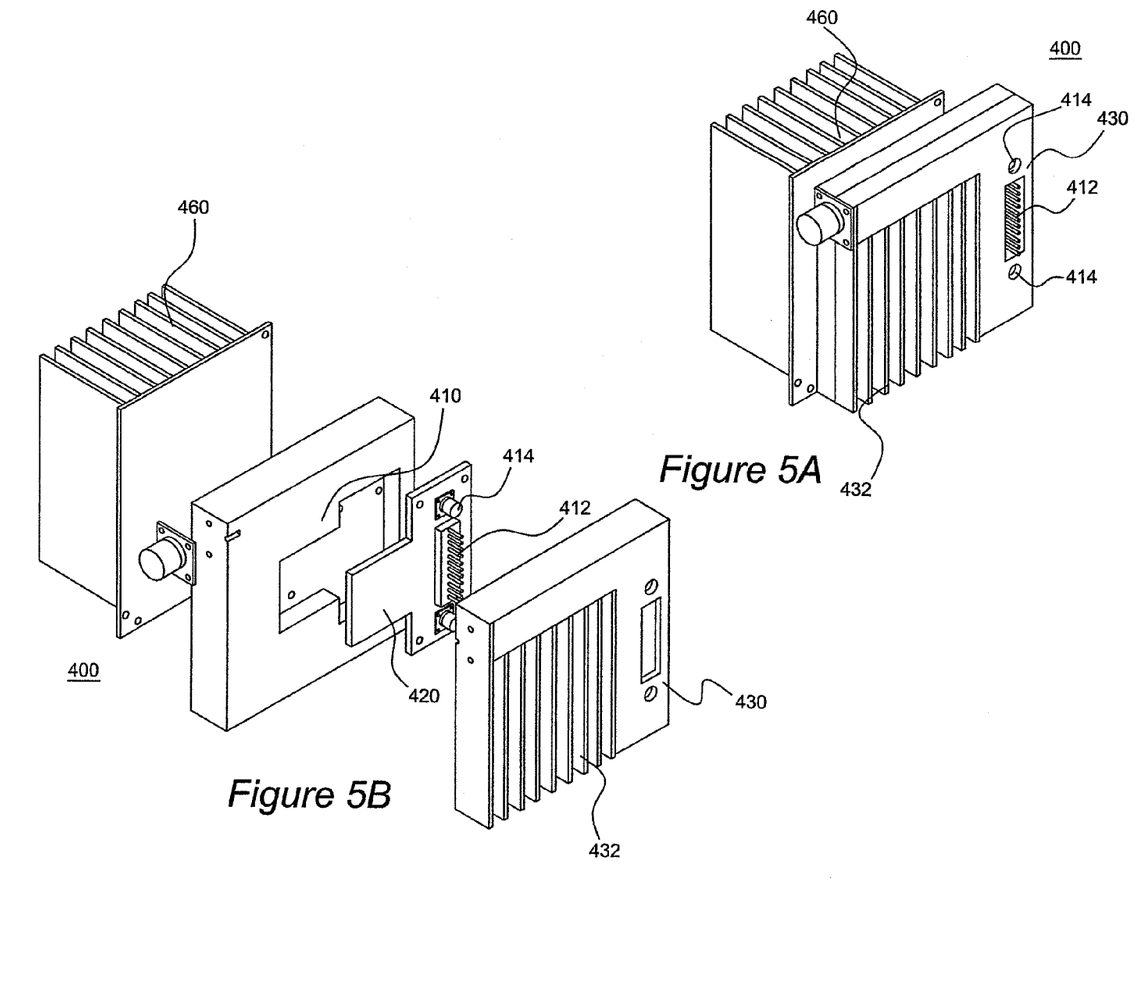
FIG. 5A is a perspective view of a module according to another embodiment of the present subject matter.
FIG. 5B is an exploded view of the module of FIG. 5A.

FIG. 4A is a plan view of an assembly according to another embodiment of the present subject matter. FIG. 4B is a cross section of the assembly of FIG. 4A along line A-A. FIG. 5A is a perspective view of a module according to another embodiment of the present subject matter, and FIG. 5B is an exploded view of the module of FIG. 5A. With reference to FIGS. 4A, 4B, 5A, and 5B, a module 400 may include amplifying and/or bias circuitry and components 402 assembled on a baseplate 410 and a transition board 420 operatively and/or removably connected to the circuitry 402. Connectors 412 are provided on the transition board 420 adaptable to mate with a transmitter PCB 450 positioned in an assembly 500. Additional connectors 414 such as RF connectors may be provided on the module 400 to supply appropriate RF connections with the transmitter PCB 450. In alternative embodiments of the present subject matter, any one or all of the connectors 412, 414 may be re-oriented ninety degrees to facilitate in a blind mate connection with the transmitter PCB 450. The module 400 may further include a cover 430 or body forming a cavity with the baseplate 410 to contain the transition board 420 and amplifying and/or bias circuitry and components 402. Portions of the cover 430 may include fins 432 or other structures to transfer heat from the module 400. Further, a fan 434 may be operatively connected to the transmitter PCB 450 via a fan connection 452 to provide additional transfer of heat from the module 400. An isolator 404 may also be provided operatively connected to the module 400. An additional heat sink 460 may be removably attached to the module 400 to assist in heat transfer therefrom, and the transmitter PCB 450 may also be equipped with a heat sink 462 to remove heat. Backplane connectors 502 may be provided on the assembly 500 to allow connections to other communication system components and circuitry.

Figure 6:
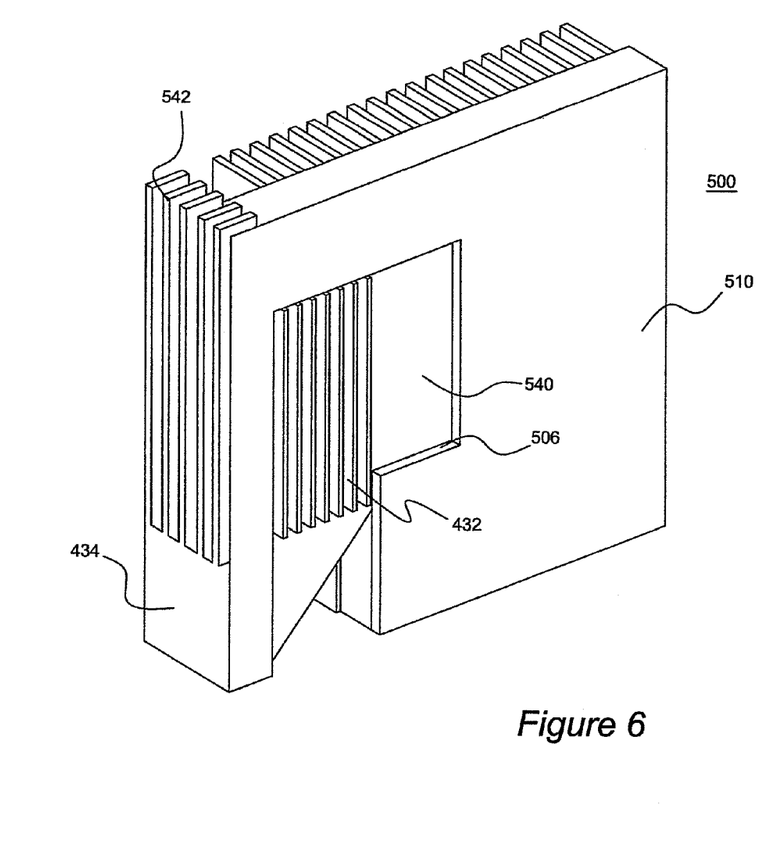
FIG. 6 is a perspective view of the assembly of FIGS. 4A and 4B.

FIG. 6 is a perspective view of the assembly of FIGS. 4A and 4B. With reference to FIG. 6, a module according to an embodiment of the present subject matter is shown mated with an assembly 500. The assembly 500 comprises a structure having an indentation 506 for accepting the module 400 such that the module 400 is operatively connected to the transmitter PCB 450. The assembly 500 further includes a second cover 540 to enclose the module 400. A fan 434 may be removably attached to the assembly 500 and operatively attached to the transmitter PCB 450 to provide additional transfer of heat from the module 400. The assembly 500 may also employ a frontal heat sink 542.

Figure 7A:
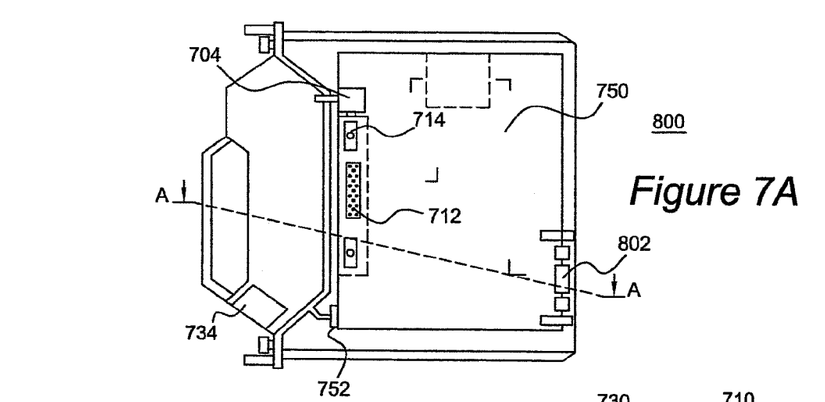
FIG. 7A is a plan view of an assembly according to an alternative embodiment of the present subject matter.
Figure 7B:
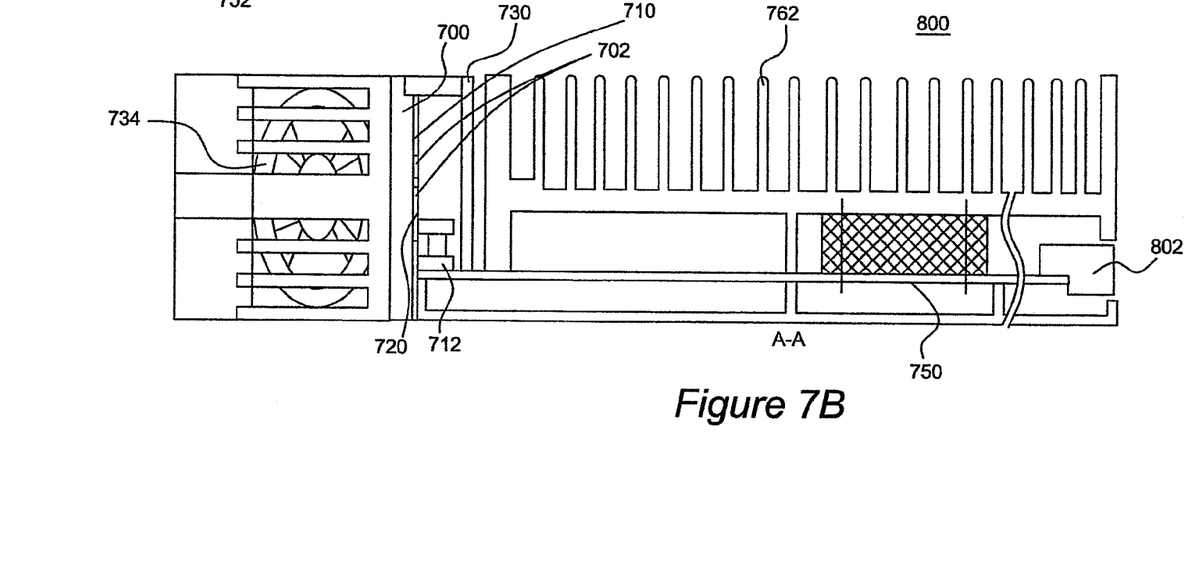
FIG. 7B is a cross section of the assembly of FIG. 7A along line A-A.

FIG. 7A is a plan view of an assembly according to an additional embodiment of the present subject matter. FIG. 7B is a cross section of the assembly of FIG. 7A along line A-A. With reference to FIGS. 7A and 7B, a module 700 may include amplifying and/or bias circuitry and components 702 assembled on a baseplate 710 and a transition board 720 operatively and/or removably connected to the circuitry 702. Connectors 712 are provided on the transition board 720 adaptable to mate with a transmitter PCB 750 positioned in an assembly 800. Additional connectors 714 such as RF connectors may be provided on the module 700 to supply appropriate RF connections with the transmitter PCB 750. The module 700 may further include a cover 730 or body forming a cavity with the baseplate 710 to contain the transition board 720 and amplifying and/or bias circuitry and components 702. A fan 734 may be operatively connected to the transmitter PCB 750 via a fan connection 752 to provide additional transfer of heat front the module 700. An isolator 704 may also be provided operatively connected to the module 700. The transmitter PCB 750 may be equipped with a heat sink 762 to remove heat. Backplane connectors 802 may be provided on the assembly 800 to allow connections to other communication system components and circuitry.

Figure 8:
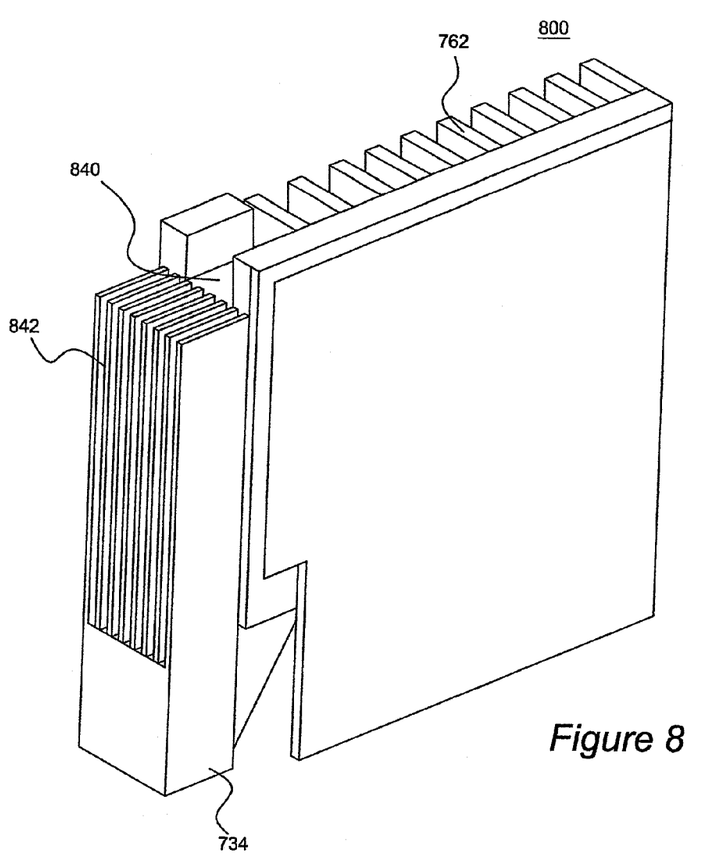
FIG. 8 is a perspective view of the assembly of FIGS. 7A and 7B.

FIG. 8 is a perspective view of the assembly of FIGS. 7A and 7B. With reference to FIG. 8, a module according to an embodiment of the present subject matter is shown mated with an assembly 800. The assembly 800 comprises a structure having an indentation for accepting the module 700 such that the module 700 is operatively connected to the transmitter PCB 750. The assembly 800 further includes a second cover 840 to enclose the module 700. A fan 734 may be removably attached to the assembly 800 and operatively attached to the transmitter PCB 750 to provide additional transfer of heat from the module 700. The assembly 800 may also employ a frontal heat sink 842.

It is thus an aspect of embodiments of the present subject matter to exclude assemblies having a ringframe, baseplates having a bathtub-style housing, and/or carriers in the respective RF modules. It is a further aspect of the present subject matter to reduce the package costs of thin film assemblies.

Embodiments of the present subject matter provide for uncompromised performance to be achieved with MMICs and ceramic components because of the flexibility of the packaging and assembly approach. Embodiments of the present subject matter allow for automated pick and place and automated wirebonding. Transition boards according to embodiments of the present subject matter provide for low cost connections to the higher level assembly which provides a protected EMI environment for the respective module.

One embodiment of the present subject matter provides a module comprising a baseplate having a microwave or millimeter wave component attached thereto and a substantially planar transition board having a first connector attached to a first side thereof, the first connector operatively connected to the component. The transition board also includes a second connector attached to a second side thereof, the second connector operatively connected to the component through the board. The module further comprises a cover where the cover and baseplate form a cavity containing the board and component, and where the second connector is operatively connected to a third connector disposed outside of the cavity. An alternative embodiment may further include a fourth connector on the transition board operatively connected to the components for providing a signal to an external component or device or receiving a signal from an external component or device.

Another embodiment of the present subject matter provides an assembly comprising a structure having an indentation for accepting a module, the indentation bounded on one side by a printed circuit board. The module may comprise module a baseplate having a microwave or millimeter wave component attached thereto and a substantially planar transition board having a first connector attached to a first side thereof, the first connector operatively connected to the component. The transition board also includes a second connector attached to a second side thereof, the second connector operatively connected to the component through the board. The module further comprises a cover where the cover and baseplate form a cavity containing the board and component. The module may be disposed within the indentation such that the second connector is operatively connected to the printed circuit board. An alternative embodiment may further include another connector on the transition board operatively connected to the components for providing a signal to an external component or device or receiving a signal from an external component or device. The assembly further comprises a second cover to enclose the module to provide electromagnetic interference protection.

An additional embodiment of the present subject matter provides a communication system operating in a predetermined frequency range comprising a plurality of assemblies, at least one assembly comprising a structure having an indentation for accepting a module, the indentation bounded on one side by a printed circuit board. The module may comprise module a baseplate having a microwave or millimeter wave component attached thereto and a substantially planar transition board having a first connector attached to a first side thereof the first connector operatively connected to the component. The transition board also includes a second connector attached to a second side thereof, the second connector operatively connected to the component through the board. The module further comprises a cover where the cover and baseplate form a cavity containing the board and component. The module may be disposed within the indentation such that the second connector is operatively connected to the printed circuit board. An alternative embodiment may further include another connector on the transition board operatively connected to the components for providing a signal to an external component or device or receiving a signal from an external component or device. The assembly further comprises a second cover to enclose the module to provide electromagnetic interference protection.

A further embodiment of the present subject matter provides a method for eliminating feed-throughs in an assembly. The method comprises the steps of providing a structure having an indentation for accepting a module, the indentation bounded on one side by a printed circuit board and operative connecting a module to the printed circuit board. The module comprises a baseplate having a microwave or millimeter wave component attached thereto and a substantially planar transition board having a first connector attached to a first side thereof, the first connector operatively connected to the component. The transition board also includes a second connector attached to a second side thereof, the second connector operatively connected to the component through the board. The module further comprises a cover where the cover and baseplate form a cavity containing the board and component. The method further comprises the step of removably attaching a second cover to the structure to enclose the module. An alternative embodiment may further comprise providing electromagnetic interference protection to the module. An additional embodiment may also comprise transferring heat generated from the component to the structure.

As shown by the various configurations and embodiments illustrated in FIGS. 1-8, a system, method and apparatus for packaging for low-cost, high-performance microwave and millimeter wave modules have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What we claim is:
1. A system comprising:
a wireless transceiver printed circuit board (PCB) enabled to transmit and receive a wireless signal;
a baseplate having a microwave or millimeter wave component attached thereto;
a substantially planar transition board having a first connector attached to a first side of the transition board and operatively connected to the component, and a second connector attached to a second side of the transition board and operatively connected to the component through the transition board, wherein the first side of the transition board and the second side of the transition board are not the same side; and
a cover;
wherein the cover and the baseplate form a cavity containing the transition board and the component;
wherein the wireless transceiver PCB is disposed outside the cavity and operatively connected to a third connector disposed outside of the cavity; and
wherein the second connector is mated with the third connector and the second connector is operatively connected to the wireless transceiver PCB through the third connector, thereby operatively connecting the component to the wireless transceiver PCB.

2. The system of claim 1 wherein the component is selected from the group consisting of: monolithic microwave integrated circuit chips, field effect transistors, transistors, diodes, mixers, multipliers, modulators, amplifiers, attenuators, switches, circulators, isolators, filters, couplers, detectors, splitters, combiners, substrates, or combinations thereof.

3. The system of claim 1 wherein connection between the second and third connectors is a blind mate connection.

4. The system of claim 1 wherein the board is removably attached to the baseplate.

5. The system of claim 1 wherein connection between the first connector and the component is a direct connection without a wire or cable.

6. The system of claim 1 wherein power and signal connectors are not attached to either the baseplate or the cover.

7. The system of claim 1 wherein the baseplate and the cover do not provide electromagnetic interference protection.

8. The system of claim 1 wherein the transition board further includes a fourth connector attached to another side of the transition board, the fourth connector operatively connected to the component through the transition board.

9. The system of claim 1 wherein the transition board further includes a fourth connector attached to another side of the transition board, the fourth connector directly connected to the component.

10. An assembly comprising:
a wireless transceiver printed circuit board (PCB) enabled to transmit and receive a wireless signal;
a structure having an indentation for accepting a module, the indentation bounded on one side by a printed circuit board operatively connected to the wireless transceiver PCB;
the module comprising:
a baseplate having a microwave or millimeter wave component attached thereto;
a substantially planar transition board having a first connector attached to a first side of the transition board and operatively connected to the component, and a second connector attached to a second side of the transition board and operatively connected to the component through the transition board, wherein the first side of the transition board and the second side of the transition board are not the same side; and
a first cover, wherein the first cover and the baseplate form a cavity containing the transition board and the component; and
a second cover,
wherein the module is disposed within the indentation such that the second connector is mated with a third connector disposed outside the cavity and the second connector is operatively connected to the wireless transceiver PCB through the third connector, thereby operatively connecting the component to the wireless transceiver PCB, and
wherein the second cover and the structure enclose the module.

11. The assembly of claim 10 wherein the component is selected from the group consisting of: monolithic microwave integrated circuit chips, field, effect transistors, transistors, diodes, mixers, multipliers, modulators, amplifiers, attenuators, switches, circulators, isolators, filters, couplers, detectors, splitters, combiners, substrates, or combinations thereof.

12. The assembly of claim 10 wherein connection between the second connector and the printed circuit board is a blind mate connection.

13. The assembly of claim 10 wherein the transition board is removably attached to the baseplate.

14. The assembly of claim 10 wherein the second cover and the structure enclose the module so as to provide electromagnetic interference protection.

15. The assembly of claim 10 wherein connection between the first connector and the component is a direct connection without a wire or cable.

16. The assembly of claim 10 wherein power and signal connectors are not attached to either the baseplate or the first cover.

17. The assembly of claim 10 wherein the baseplate and the first cover do not provide electromagnetic interference protection.

18. The assembly of claim 10 wherein the structure provides a second structure to remove heat from the module.

19. The assembly of claim 18 wherein the second structure is selected from the group consisting of: heat fins, fans, heat pipes.

20. The assembly of claim 10 wherein the transition board further includes a fourth connector attached to another side of the transition board, the fourth connector operatively connected to the component through the transition board.

21. The assembly of claim 10 wherein the transition board further includes a fourth connector attached to another side of the transition board, the fourth connector directly connected to the component.

22. The assembly of claim 10 wherein the second cover and the indentation provide electromagnetic interference protection.

23. The assembly of claim 10 further comprising a gasket which provides electromagnetic interference protection.

24. A communication system operating in a predetermined frequency range comprising:
a wireless transceiver printed circuit board (PCB) enabled to transmit and receive a wireless signal;
a plurality of assemblies, at least one assembly comprising:
a structure having an indentation for accepting a module, the indentation bounded on one side by a printed circuit board operatively connected to the wireless transceiver PCB:
the module comprising:
a baseplate having a microwave or millimeter wave component attached thereto;
a substantially planar transition board having a first connector attached to a first side of the transition board and operatively connected to the component, and a second connector attached to a second side of the transition board and operatively connected to the component through the transition board, wherein the first side of the transition board and the second side of the transition board are not the same side; and
a first cover, wherein the first cover and the baseplate form a cavity containing the transition board and the component; and
a second cover,
wherein the module is disposed within the indentation such that the second connector is mated with a third connector disposed outside the cavity and the second connector is operatively connected to the wireless transceiver PCB through the third connector, thereby operatively connecting the component to the wireless transceiver PCB, and
wherein the second cover and the structure enclose the module.

25. The system of claim 24 wherein the component is selected from the group consisting of: monolithic microwave integrated circuit chips, field effect transistors, transistors, diodes, mixers, multipliers, modulators, amplifiers, attenuators, switches, circulators, isolators, filters, couplers, detectors, splitters, combiners, substrates, or combinations thereof.

26. The system of claim 24 wherein connection between the second connector and the printed circuit board is a blind mate connection.

27. The system of claim 24 wherein the transition board is removably attached to the baseplate.

28. The system of claim 24 wherein the second cover and the structure enclose the module so as to provide electromagnetic interference protection.

29. The system of claim 24 wherein connection between the first connector and the component is a direct connection without a wire or cable.

30. The system of claim 24 wherein power and signal connectors are not attached to either the baseplate or the first cover.

31. The system of claim 24 wherein the baseplate and the first cover do not provide electromagnetic interference protection.

32. The system of claim 24 wherein the structure provides a second structure to remove heat from the module.

33. The system of claim 32 wherein the second structure is selected from the group consisting of: heat fins, fans, heat pipes.

34. The system of claim 24 wherein the transition board further includes a fourth connector attached to another side of the transition board, the fourth connector operatively connected to the component through the transition board.

35. The system of claim 24 wherein the transition board further includes a fourth connector attached to another side of the transition board, the fourth connector directly connected to the component.

36. The system of claim 24 wherein the second cover and the indentation provide electromagnetic interference protection.

37. The system of claim 24 wherein the structure further comprises a gasket which provides electromagnetic interference protection.

* * * * *